United States Patent [19]

Thomas et al.

[11] Patent Number: 4,819,201

[45] Date of Patent: Apr. 4, 1989

[54] ASYNCHRONOUS FIFO DEVICE COMPRISING A STACK OF REGISTERS HAVING A TRANSPARENT CONDITION

[76] Inventors: Alain Thomas, Ar Santé; Michel Servel, Le Rhu en Servel, both of 22300 Lannion, France

[21] Appl. No.: 77,999

[22] Filed: Jul. 27, 1987

Related U.S. Application Data

[63] Continuation of Ser. No. 655,732, Sep. 28, 1984, abandoned.

[30] Foreign Application Priority Data

Sep. 29, 1983 [FR] France ............................. 83 15510

[51] Int. Cl.[4] .............................................. G11C 13/00
[52] U.S. Cl. ..................................... 364/900; 365/221
[58] Field of Search ............................. 365/221, 239; 364/900 MS File, 200 MS File

[56] References Cited

U.S. PATENT DOCUMENTS

| | | | |
|---|---|---|---|
| 3,378,776 | 4/1968 | Goldberg et al. | 377/69 |
| 3,953,838 | 4/1976 | Gilberg et al. | 365/78 |
| 3,988,717 | 10/1976 | Kisylia | 364/200 |
| 4,157,587 | 6/1979 | Joyce | 364/200 |
| 4,369,510 | 1/1983 | Johnson et al. | 364/900 |
| 4,486,854 | 12/1984 | Yuni | 364/900 |
| 4,558,429 | 12/1985 | Barlow et al. | 364/900 |
| 4,642,797 | 2/1987 | Hoberman | 365/239 |

FOREIGN PATENT DOCUMENTS

2009984 6/1979 United Kingdom .

OTHER PUBLICATIONS

*Digital Analog Communication Systems,* by Shanmugam, 1979, pp. 189–209.
Description Of The Am 3341 FIFO Operation.

*Primary Examiner*—Gary V. Harkcom
*Assistant Examiner*—Lawrence E. Anderson
*Attorney, Agent, or Firm*—Larson & Taylor

[57] ABSTRACT

An asynchronous FIFO (firstin, firstout) device suitable for use as a buffer comprises a stack having a plurality of sections. Each section has a data storage register and a control subassembly. Each assembly is associated with one of said data storage registers. A single data input is connected to the first data storage register. The data storage registers have a transparent condition and a latched condition and each subassembly comprises a 2-to-1 MUX (multiplexer) having a first input connected to receive a logic signal indicative of the condition of the preceding subassembly, a second input connected to receive a logic signal indicative of the condition of the following subassembly and an output connected to the associated storage register. The MUX is constructed to deliver on its output a signal representative of the condition of the subassembly and its internal connections are determined by the logic level of the output signal of the MUX.

8 Claims, 4 Drawing Sheets

ASYNCHRONOUS FIFO DEVICE COMPRISING A STACK OF REGISTERS HAVING A TRANSPARENT CONDITION

This application is a continuation of application Ser. No. 655,732, filed Sept. 28, 1984, now abandoned.

BACKGROUND AND SUMMARY OF THE INVENTION

The invention relates to FIFO (first in, first out) devices which are widely used in data processing and digital signal processing, more particularly to provide buffer storage. The invention relates more particularly to FIFO devices which are asynchronous, i.e. which do not demand a predetermined time relationship between the input and the output, of the kind comprising a cascade stack of p identical data storage registers, and a control arrangement of p identical subassemblies each associated with one of the registers (p being an integer).

In a typical example, the FIFO comprises a stack of p registers all comprising the same number of bit positions, the logic control arrangement being formed by a mechanism with p bit positions each associated with a storage register.

The FIFO is so designed that a data word fed into the first register progresses spontaneously from register to register until it becomes stabilized in the last available register. Each reading "empties" the last register of the stack, and all information words stored go down by one step in the FIFO.

FIG. 1 shows a conventional embodiment of such a FIFO. Each of the registers $10_1, \ldots 10_p$ is associated with a subassembly comprising a RS flip-flop $12_1, \ldots 12_p$, all FFs being in cascade. Each subassembly delivers a logic signal which acts on the associated register and indicates the empty or full condition thereof. The logic signal is produced as a function of the output signals of the preceding (or upstream) subassembly, the following (or downstream) subassembly, and the subassembly itself, the two end subassemblies of course requiring a slightly different arrangement.

Referring to FIG. 1, when the (i)th subassembly contains a binary 1, while the (i+1)th subassembly contains a 0, the subassembly (i+1) delivers, via an AND gate 14, a control signal for loading the register of rank (i+1), such signal being used to set the subassembly (i+1) at 1, and to reset the subassembly (i) to 0.

Therefore, the output logic signal of a subassembly such as $12_1$ acts on the following subassembly, for example, $12_2$, only after passing through the subassembly itself, as shown by the connections in heavy lines in FIG. 1, where the various inputs and outputs have the usual abbreviations:

SI : writing request (shift in)
SO : reading request (shift out)
DE : data input
DS : data output
IR : input validation (input ready)
OR : reading validation (output ready).

Such a system therefore has a considerable response time.

FIG. 1 also shows in brackets the abbreviations conventionally used on components of French origin.

In a FIFO of the kind illustrated in FIG. 1 the data falls through the data registers at the rate of the set and reset of the RS FFs; if the FIFO, which may be considered as a queue, is almost empty, the fall through (the interval between the inputting of a data word into the first register and the availability of the word at the output) lasts for a considerable time, since the registers $10_1$ to $10_p$ copy the item of information in response to the successive logic signals delivered by the corresponding subassemblies.

It is an object of the invention to supply a FIFO or queueing device of the kind specified which operates rapidly and almost independently of the degree to which the FIFO is filled and is however simple in construction.

According to the invention, there is provided particularly a FIFO device in which the data storage registers are of the type having a latched condition and a transparent condition. Each subassembly comprises switch means having a first input connected to receive a logic signal indicative of the condition of the subassembly, a second input connected to receive a logic signal indicative of the condition of the following subassembly and an output connected to the associated one of said data storage registers. The switch means is constructed to deliver on its output a signal indicative of the state of either the upstream or the downstream subassembly, in dependence on whether the subassembly comprising the switch means is free or not.

The individual registers embodied in the invention can be of various types available in the trade, for example they can be F100-150 registers (FAIRCHILD). In such a register, a data word applied at the input appears instantly at the output when the control input is at a first logic level. When such control input passes to a second logic level, the data applied at the input of the register immediately before the transition remains available at the output.

As a result of the use of such registers, the sequence of registers causes no slowing down of the fall through of the data along the cascade when the registers are clear and transparent.

Substitution of registers having a "transparent" state for conventional registers used for forming FIFOs in the prior art may at first glance appear as obvious. However, mere substitution does not provide an advantage, since the control bit of the control registers which accompanies the data word during its fall through in the cascade must also progress far enough to enable access to the data at the output. However, progression by "request-acknowledgment" in the RS FFs used in the prior art subassemblies is slow by nature, so that the substitution of one type of register for another is in itself no advantage and would normally be disregarded as being useless.

To get over the problem, the inventors completely set aside the prior art approaches as regards the make-up of the subassemblies. In the queueing device according to the invention, as defined hereinbefore, the control logic arrangement is such as to deliver exclusively, during the writing operation, logic state signals which fall through along with the data through the data storage registers until the data reaches the last empty register preceding a full register.

In a preferred embodiment each switch means is a 2-to-1 multiplexer. The output of the multiplexer directly controls the state of the associated storage register.

In general, each multiplexer will have an input connected to the output of the multiplexer of the preceding stage, an input connected to the output of the followng stage, and a control input connected to its own output, the associated register being transparent when it receives a logic "zero" from the multiplexer output, which reflects the state of the input connected to the preceding multiplexer when the control input receives a zero, and reflects the state of the input connected to the following multiplexer when the control input receives a 1.

To enable the sequence of multiplexers to operate correctly, as a rule the rise of the information bit from each multiplexer to the preceding one must be delayed. For this purpose, it is sufficient to apply the output of each multiplexer to the preceding one via a time delay element. The delay element will be such that the sum of the delay which it provides and the time for passing through the multiplexer is greater than the switching time of the multiplexer.

The FIFO may be provided with state-indicating outputs taken from the outputs of the switches of at least certain of the stages or sections. A logic filter cell can be located on each of the outputs for eliminating transients caused by the descent or ascent of the data along the stack.

The invention will be more clearly understood from the following description of an examplary embodiment thereof, with reference to the accompanying drawings.

SHORT DESCRIPTION OF THE DRAWINGS

FIG. 1, already mentioned, is a block diagram showing a prior art FIFO device,

FIG. 2 is a block diagram showing the cooperation between three successive subassemblies of a FIFO device according to the invention, FIG. 3 is a block diagram showing the overall construction of a FIFO device comprising subassemblies of the kind shown in FIG. 2, FIG. 4 is a timing diagram showing the outline of the signals which appear at various locations on the block diagram of FIG. 3, FIG. 5 is a block diagram showing the output filtering for more reliable operation, FIG. 6 is a schematic diagram of a filtering cell which can be used in the circuit shown in FIG. 5, and FIG. 7 is a waveform diagram showing the signals occuring in the filtering operation.

DETAILED DESCRIPTION OF A PREFERRED EMBODIMENT

Figure 2:
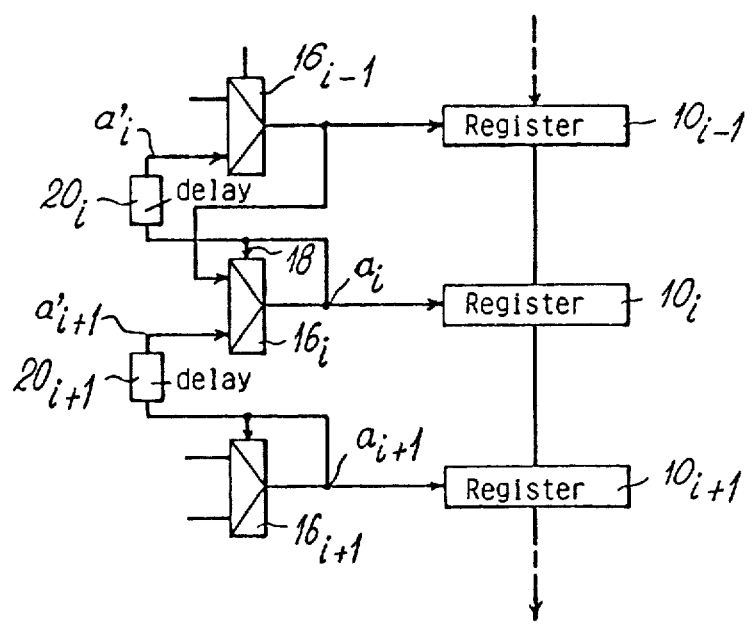
Figure 3:
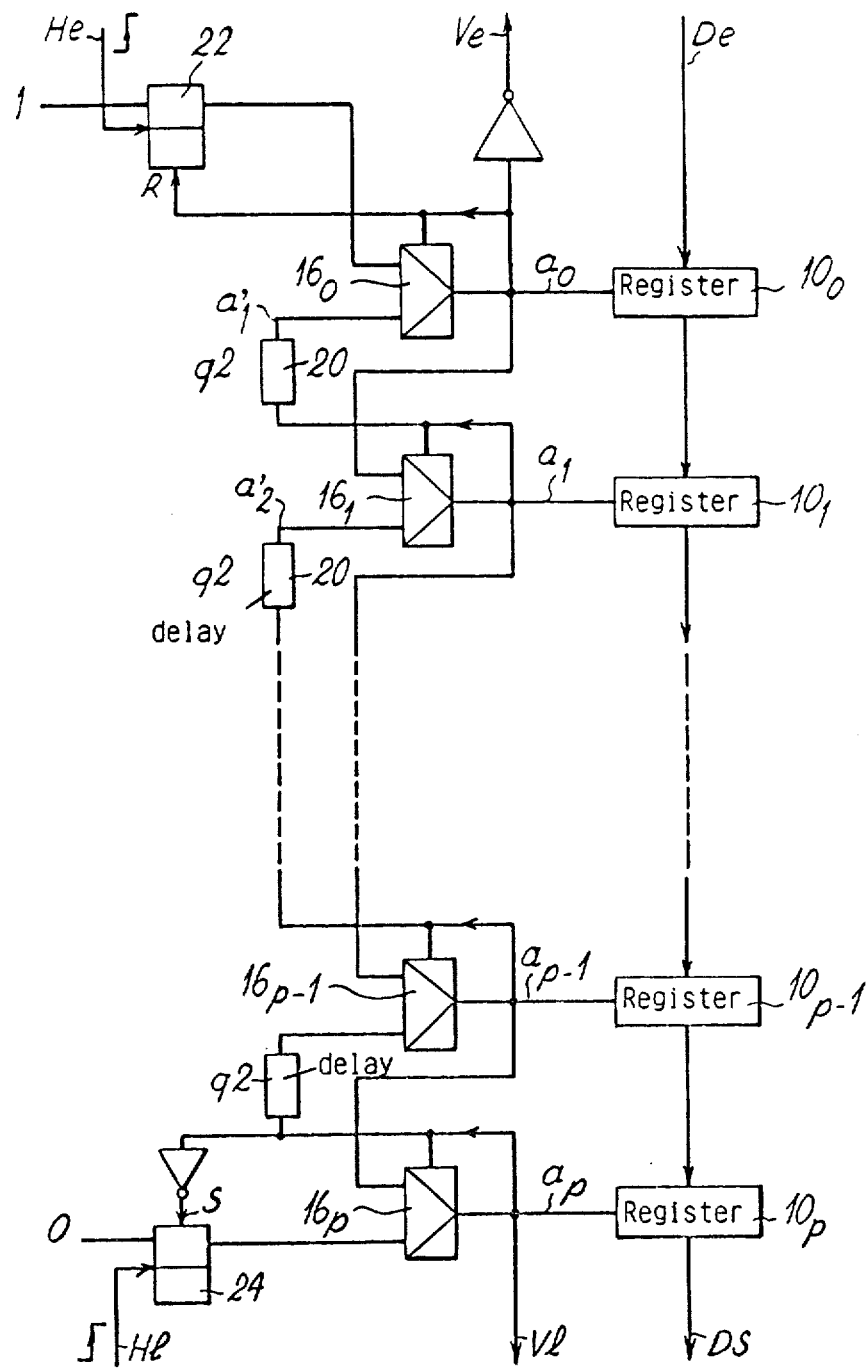

The block diagram of a FIFO or "queue" device according to the invention is illustrated in FIG. 2, which shows diagrammatically the method of control by multiplexer on three successive registers, FIG. 3 showing the control subassemblies of the first and last registers, whose structure is special.

FIG. 2 shows a switch 16, associated with the register $10_i$, formed by a multiplexer. The output $a_i$ of the multiplexer directly controls the state of the associated register: if $a_i=0$, the register is transparent, while if $a=1$, the register is latched. The operation of the switch $16_i$ is governed by three sources of information, its present state, the state of the stage above $16_{i-1}$, and the state of the stage below $16_{i+1}$. However, only two of these sources are decisive at any particular moment, since if the stage is free, the action of the switch $16_i$ is determined only by the state of the stage $i_{-1}$.

Similarly, if it retains an item of information, its change of state can be caused only by the availability of the state $i+1$ below.

If a switch formed by a multiplexer is used, such functions can be obtained by connecting the control input 18 of the multiplexer to its output. If the output is at zero, the determining factor is the output of the multiplexer above $16_{i-1}$. If the output is at 1, the determining factor is the output of the stage $16_{i+1}$.

In practice, a delay must be introduced into the control of a multiplexer $16_i$ by the multiplexer $16_{i+1}$, for a reason which will be explained hereinafter. Such delay can be obtained by means of a delay line $20_i$ by which a change in state of the output $a_{i+1}$ is analysed in the form of an order $a'_{i+1}$ by the multiplexer $16_i$ only at the end of a time $q_2$.

Figure 1:
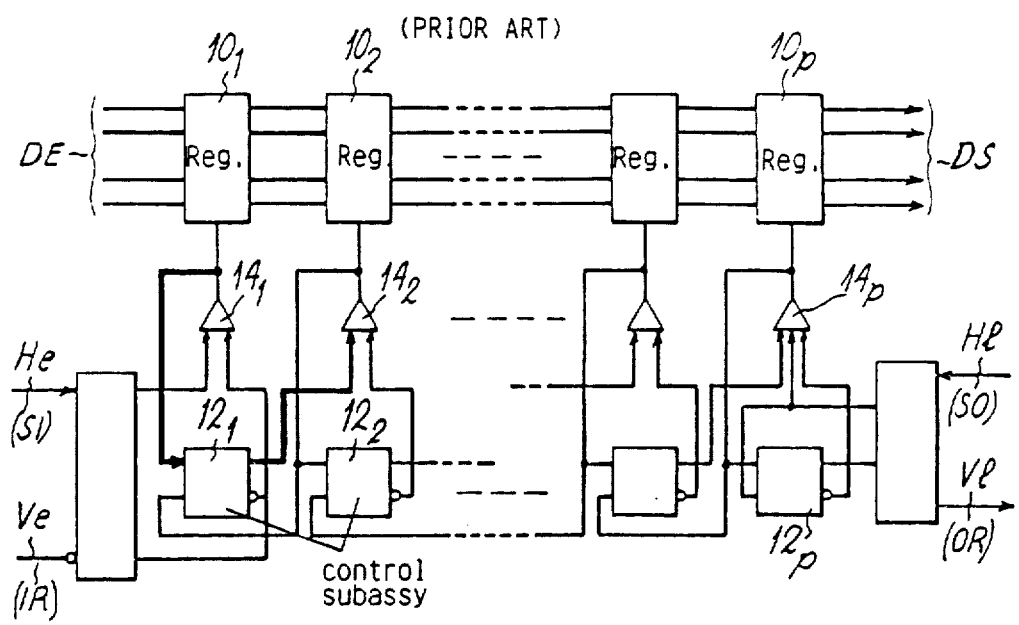

FIG. 3 again shows the usual inputs and outputs He, HI, DE, DS, Ve and VI already shown in FIG. 1. The writing request takes the form of a rising front at the input He connected to a trigger 22 for taking into account external writing requests. The word to be written, placed at the input DE of the queue when the rising front is applied, then passes through all the registers in the clear state, to be stored in the last register.

Similarly, reading requests so take the form of rising edges applied to the input H1 and, when the queue is not empty, the first accessible item of data is available at the output DS. The activation of the input H1 moreover destroys such item of information, which is replaced by the contents of the register $10_{p-1}$ immediately above $10_{p-1}$, unless it was empty.

Figure 4:
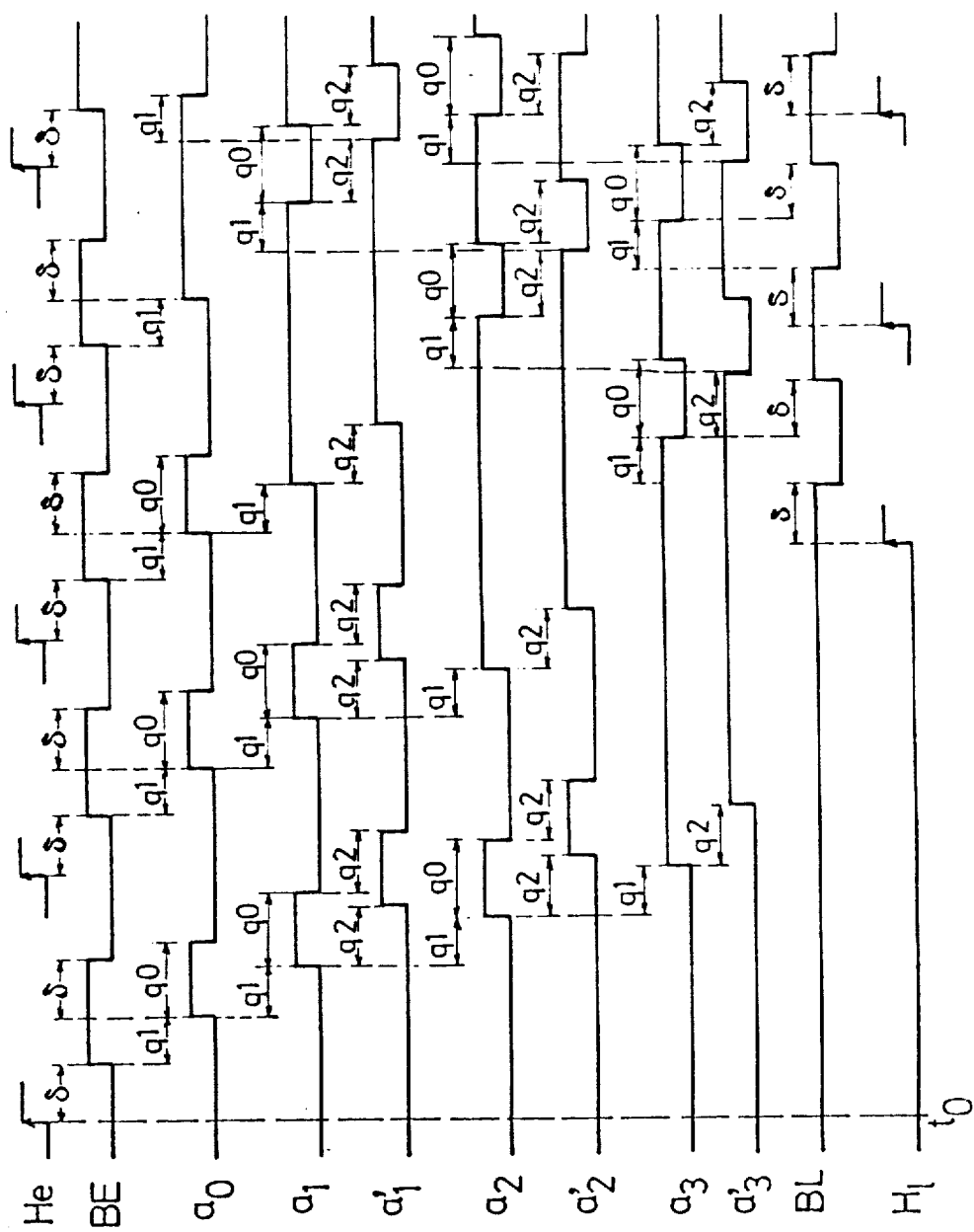

The actual operation of the circuits can be seen from the chronogram in FIG. 4, which shows the writing and reading cycles. In FIG. 4 each of the lines shows the outline of the signals which appear at that point of the schematic diagram in FIG. 3 which has the same reference. To simplify matters, we shall suppose that the queue has four stages—i.e., comprises four registers $10_0$, $10_1$, $10_2$ and $10_3$.

Three important constants of time appear in this operation:

$q_0$: the switching time of each multiplexer 16—i.e., the time at the end of which a control order is reflected at the output;

$q_1$: the time of passing through the multiplexer—i.e., the time at the end of which the state of the analyses input is reflected at the output;

$q_2$: the time for passing through a delay line 20.

The time $\delta$ of response of the writing trigger 22 and reading trigger 24 are also involved at the input and output.

We shall suppose that the item of information progresses through the registers 10 when they are clear more quickly than through the control logic sequence. However, if the contrary were to be the case, it would be enough to cause a prolongation of the time $q_1$ for passing through the multiplexers or to preposition the data DE in relation to the generation of the signal He with an advance adequate to guarantee that the item of information has arrived at the end of the queue when the queue is empty, before the control signal delivered by the last demultiplexer $16_p$ latches the last register $10_p$.

In the case shown in FIG. 4, a writing order takes the form at the time $t_0$ of a rising front at the input He. At the end of time $\delta$, the rising front causes the writing trigger 22 to rise (line BE). If we suppose that the register $10_0$ is empty—i.e., clear —the output $a_0$ is initially a 0. At the end of the time $q_1$ for passing through the multiplexer $16_0$, the output $a_0$ passes to 1 and switches the multiplexer $16_0$ again, at the end of the switching time $q_0$, since the signal $a_1$, and therefore the signal $a'_1$, is at zero if the register $10_1$ is empty.

The item of information therefore descends as far as the last register, which preceeds a full and locked register.

FIG. 4 shows the operation of the delays $q_2$ in the control circuits of each multiplexer relative to the preceding multiplexer. If we suppose that the output signals $a_i$ and $a_{i+1}$ of two consecutive multiplexers $16_i$ and $16_{i+1}$ (FIG. 2) are LOW, the signal $a_i$ goes HIGH following writing in the register $10_i$. The multiplexer $16_i$ looks at $a'_{i+1}$ at the end of the switching time $q_0$ (FIG. 4). At that moment $a'_{i+1}$ must reflect the state of $a_{i+1}$ before the latter has itself undergone switching. To obtain correct operation, the different propagation times must be connected by the relation:

$$q_0 < q_i + q_2$$

FIG. 4 also shows that the time of descent of the item of information by stages is equal to $q_1$, while the time of ascent of information of a "hole"—i.e., the existence upstream of a register empty of information is $q_1 + q_2$.

The queue whose basic construction is shown in FIG. 3 must have state indicators if information is to be available concerning the contents of the queue.

The not-full or not-empty states of the queue are indicated, as in a conventionally constructed register queue, by signals Ve and V1 taken from the output of the first multiplexer and the output of the last multiplexer respectively. Ve=0 means that the first register $10_0$ is latched and that no writing can therefore be carried out.

Conversely, V1=1 indicates that information is available in the last register $10_p$.

The queue can advantageously be completed by elements indicating the intermediate filling states. Such elements are shown diagrammatically in FIG. 5.

Figure 5:
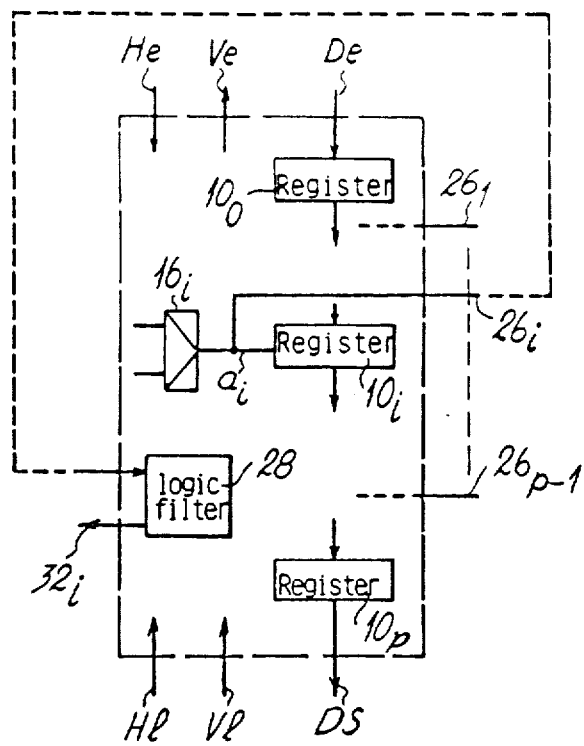
Figure 6:
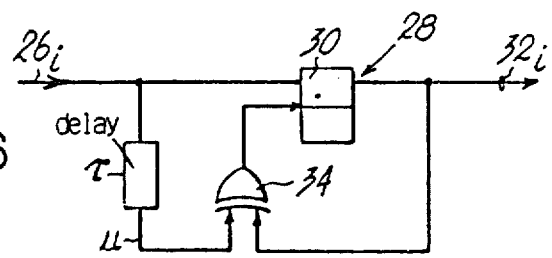
Figure 7:
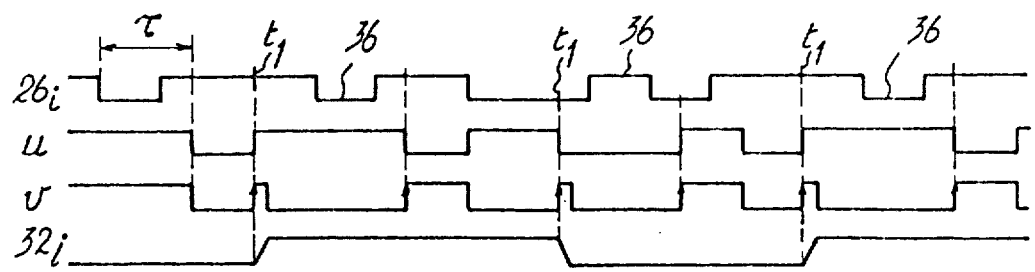

FIG. 5 shows only the registers $10_0$, $10_i$ and $10_p$, and also the inputs and outputs. Basically, in order to determine that the queue is filled at least as far as the level of the register i, it is sufficient to check that the corresponding signal $a_i$ is at the level 1. The informaiton can then be taken from the intermediate outputs $26_1$, $26_i$, $26_{p-1}$. However, this indication is uncertain, due to the transient effects caused by the progression of the information and holes. This defect can be eliminated by interposing on each of the outputs 26 a logic filter cell 28 adapted to eliminate positive or negative pulses having a duration less than a predetermined value. The filtering cell 28 can be constructed as shown in FIG. 6, comprising a trigger 30 interposed on the path of the signal to the output $32_i$. The clock input of the trigger 30 receives an order worked out by an EXCLUSIVE OR gate 34 whose inputs are connected on the one hand to the output $32_i$, and on the other to the input, via a delay line $\tau$. As soon as the gate 34 detects a difference between the input signal delayed by $\tau$ and the output signal, it actuates the clock input of the trigger 30, which grasps the present state of $26_i$: the chronogram in FIG. 6, in which the lines indicate the shape of the signals at the locations having the same reference in FIG. 6, shows that any pulse of duration less than $\tau$, for example, those denoted by 36, causes no change in the state of the trigger 30, whose movements are caused exclusively by signals representing a genuine change in the filling of the queue, as indicated at the time $t_1$.

We claim:

1. An asynchronous FIFO device having a stack comprising a plurality of identical data storage registers, a control arrangement of a plurality of identical subassemblies each associated with a respective one of said data storage registers to form a section, and a single device data input connected to a first one of said data storage registers, wherein said data storage registers are latch registers of the type having a transparent condition and having a latch condition: wherein a first said section is connected to receive a shift in signal on a shift in terminal and data on said data input, a last said section is connected to receive a shift out signal on a shift out terminal and to deliver data on a data output, and at least one intermediate said section is connected in series relation between said first section and last section; and wherein each of said subassemblies but in the first section and in the last section comprises switch means having a first data input connected to receive a logic signal indicative of the condition of the preceding subassembly, a second data input connected to receive a logic signal indicative of the condition of the following subassembly and a data output connected to a condition control input of the associated one of said said storage registers, said switch means being constructed to deliver on said data output a signal controlling and representative of the condition of said subassembly, the condition of said switch means being determined reponsive to the logic level of the data output signal of said switch means.

2. A FIFO device according to claim 1, further comprising condition indicating outputs each connected to the output of the switch means in one of the sections in the stack.

3. A FIFO device according to claim 2, wherein at least one of said condition indicating outputs is provided with a logic filtering cell for eliminating those transients which have a duration lower than a predetermined threshold.

4. An asynchronous FIFO device having a stack comprising a plurality of identical data storage registers, a control arrangement of a plurality of identical subassemblies each associated with a respective one of said data storage registers to form a section, and a single device data input connected to a first one of said data storage registers; wherein said data storage registers are latch registers of the type having a transparent condition and having a latch condition; wherein a first said section is connected to receive a shift-in signal on a shift-in terminal and data on said data input, a last said section is connected to receive a shift-out signal on a shiftout terminal and to deliver data on a data output, and at least one intermediate said section is connected in series relation between said first section and last section; wherein each of said subassemblies but in the first section and in the last section comprises switch means having a first data input connected to receive a logic signal indicative of the condition of the preceding subassembly, a second data input connected to receive a logic signal indicative of the condition of the following subassembly and a data output connected to a condition control input of the associated one of said data storage registers, said switch means being constructed to deliver on said data output a signal controlling and representative of the condition of said subassembly, the condition of said switch means being determined responsive to the logic level of the data output signal of said switch means; and wherein each of said switch means consists of a 2-to-1 multiplexer whose output is directly connected to the condition input of the associated one of said data storage registers.

5. A FIFO device according to claim 4, wherein each of said multiplexers except in the first and last sections comprises a first data input connected to the output of the multiplexer of the preceding section in the stack and a second data input connected to the output of the multiplexer of the following section in the stack and each of said multiplexers has a control input connected to the output thereof, the data storage register associated with the multiplexer being transparent when receiving a logic zero from the output of said multiplexer, said output being caused to copy the condition of the input connected to the output of the preceding multiplexer when the control input receives a zero and being caused to copy the condition of the input connected to the following multiplexer when the control input receives a one.

6. A FIFO device according to claim 4, wherein the output of each of said multiplexers is directly connected to the control input thereof and is connected through a delay element to a data input of the preceding multiplexer in the stack.

7. A FIFO device according to claim 6, wherein said multiplexer delays the signals therethrough by a predetermined amount and wherein said delay element provides a time delay which is so selected in proportion to said amount that the sum of said time delay and of said amount be higher than the switching time of the multiplexer.

8. An asynchronous FIFO device having a stack comprising a plurality p of successive sections, p being an integer greater than 1, each section comprising:
- a storage register having a data input, a data output and a control input, said register being a transparent latch register which, for one binary level of the control signal applied to said control input, is transparent and passes data supplied to the data input at once to the data output thereof and for the complementary binary level, is in latched condition,
- and a control subassembly having a multiplexer having a first logic input, a second logic input, a logic output connected to the control input of the storage register associated thereto in the same section and a control input, said multiplexer being arranged for connecting one of the other of the logic inputs thereof to the output depending on the binary level applied to the control input thereof, said control input being connected to the logic output of the same multiplexer,
- wherein in each said section but a first section and a last section,
- the first logic input is connected to receive a logic signal indicative of the condition of the preceding subassembly and the second logic input is connected to receive a logic signal indicative of the condition of the following subassembly,
- while, in the first section, the first logic input is connected to receive a shift in signal from a shift in terminal of the device,
- and in the last section, the second logic input is connected to receive a shift out signal from a shift out terminal of the device.

* * * * *